United States Patent
Zhao et al.

(10) Patent No.: US 9,930,229 B2
(45) Date of Patent: Mar. 27, 2018

(54) EMI SHIELD WITH A LENS-SIZED APERTURE FOR CAMERA MODULES AND CAMERA MODULES INCLUDING THE SAME

(71) Applicant: OmniVision Technologies, Inc., Santa Clara, CA (US)

(72) Inventors: Qianyi Zhao, San Jose, CA (US); Heng Fan, Palo Alto, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/210,587

(22) Filed: Jul. 14, 2016

(65) Prior Publication Data

US 2018/0020131 A1    Jan. 18, 2018

(51) Int. Cl.
| | | |
|---|---|---|
| H04N 5/225 | (2006.01) |
| H05K 3/30 | (2006.01) |
| H05K 1/18 | (2006.01) |
| H05K 9/00 | (2006.01) |
| H01R 13/04 | (2006.01) |
| H05K 1/14 | (2006.01) |

(52) U.S. Cl.
CPC .......... *H04N 5/2252* (2013.01); *H01R 13/04* (2013.01); *H04N 5/2254* (2013.01); *H05K 1/148* (2013.01); *H05K 1/181* (2013.01); *H05K 3/303* (2013.01); *H05K 9/0024* (2013.01); *H05K 2201/10121* (2013.01); *H05K 2201/10151* (2013.01); *H05K 2201/10371* (2013.01)

(58) Field of Classification Search
CPC .. H04N 5/2252; H04N 5/2254; H05K 9/0024; H05K 2201/10371
See application file for complete search history.

(56) References Cited

U.S. PATENT DOCUMENTS

| | | | |
|---|---|---|---|
| 2003/0155987 A1* | 8/2003 | Kolb ...................... | H04B 15/02 333/12 |
| 2009/0021635 A1* | 1/2009 | Cheng .................. | G02B 13/001 348/374 |
| 2009/0244356 A1 | 10/2009 | Cheng | |
| 2011/0025850 A1* | 2/2011 | Maekawa .............. | H05K 9/002 348/148 |
| 2013/0083229 A1 | 4/2013 | Lin et al. | |
| 2014/0043519 A1* | 2/2014 | Azuma .................... | G03B 3/10 348/345 |

(Continued)

*Primary Examiner* — Christopher K Peterson
(74) *Attorney, Agent, or Firm* — Larry E. Henneman, Jr.; Gregory P. Gibson; Henneman & Associates, PLC

(57) ABSTRACT

An EMI shield for a camera module subassembly includes a first conductive portion covering an optical unit and a top surface of a circuit substrate of the camera module subassembly and a second conductive portion covering a bottom surface of the circuit substrate, such that the two portions are in contact. The EMI shield can also include an extension to cover a flexible circuit substrate and its connector, as well as can include an EMI attenuator over an aperture formed in the first conductive portion above the optical unit. The EMI shield of the invention provides improved EMI shielding and EM compatibility at the camera module packaging level, especially for frequencies in the megahertz and gigahertz range, by shielding substantially all of the camera module subassembly.

27 Claims, 15 Drawing Sheets

(56) References Cited

U.S. PATENT DOCUMENTS

2015/0077873 A1* 3/2015 Johnson ................ B32B 37/12
359/871
2015/0281532 A1 10/2015 Yu et al.

* cited by examiner

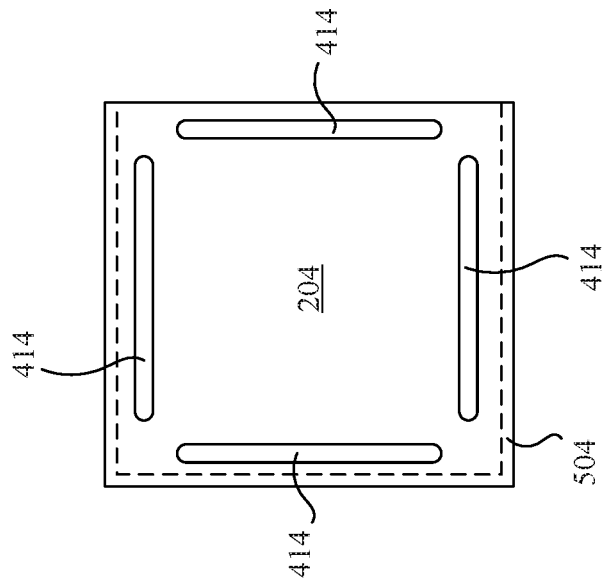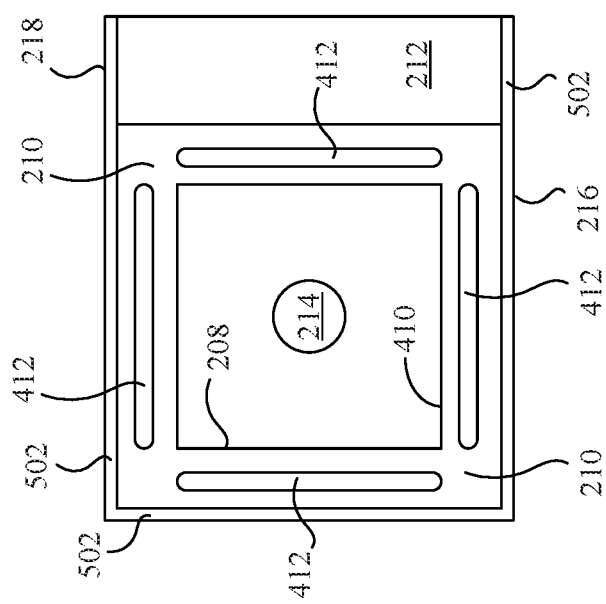
FIG. 5A
FIG. 5B

EMI SHIELD WITH A LENS-SIZED APERTURE FOR CAMERA MODULES AND CAMERA MODULES INCLUDING THE SAME

BACKGROUND OF THE INVENTION

Field of the Invention

This invention relates generally to camera modules, and more particularly to an electromagnetic interference (EMI) shield for a camera module that shields substantially the full camera module.

Description of the Background Art

Camera modules are widely incorporated into a variety of host devices including, for example, cell phones, computers, digital cameras, PDA's, etc. In addition to conventional user-controlled camera applications, more and more camera modules are being integrated into various machine-vision applications, for example, in automobiles and medical devices.

The image sensors used in the above applications continue to become more complex. For example, the resolutions of such image sensors are constantly increasing. These high definition (HD) image sensors operate internally at very high system-clock frequencies (e.g., in the megahertz (MHz) to gigahertz (GHz) ranges) and output high-speed signals (e.g., at MIPI data rate specifications) to accomplish their image-capture functions. In addition, many host devices include wireless communications equipment (e.g., cellular radios, Bluetooth, wireless networking (wi-fi) radios, etc.) in the vicinity of their camera modules. Thus, image sensors in camera modules are bathed in electromagnetic radiation from other devices, as well as contribute electromagnetic radiation to their environments, which can cause EMI issues like jamming of wireless communications, etc.

Current camera modules include electromagnetic interference (EMI) shielding. However, known EMI shields have large openings, which are typically equal to or slightly smaller than the size of the camera module bottom, to accommodate the lens barrel of the camera module. Unfortunately, these large openings act as an antenna in the direction(s) where electromagnetic waves propagate through the opening. Therefore, any EMI shielding effects are greatly compromised, especially in the high-frequency ranges mentioned above.

A goal of EMI shielding is also electromagnetic compatibility (EMC) with other electronic devices in the host device. Therefore, a weak EMI shield can also cause the EM radiation emitted by the image sensor of the camera module to interfere with other electronic componentry in the host device, which is undesirable.

What is needed, therefore, is an EMI shield for a camera module that improves EMI protection for the camera module and that improves its EMC with other devices in a common electronic environment.

SUMMARY

The present invention overcomes the problems associated with the prior art by providing an EMI shield for a camera module that shields substantially all of the camera module. The invention facilitates improved EMI shielding and EM compatibility at the camera module packaging level, especially for frequencies in the megahertz and gigahertz ranges.

A camera module according to the invention includes a circuit substrate (e.g., a rigid-flex printed circuit board), an image sensor mounted on the circuit substrate, and an optical unit coupled to a top surface of the circuit substrate over a pixel array of the image sensor, where the optical unit includes at least one optical element configured to focus an image on the pixel array. The camera module further includes an EMI shield including a first conductive portion covering the optical unit and a second conductive portion coupled to the first conductive portion and covering a bottom surface of the circuit substrate. In a particular embodiment, the first conductive portion of the EMI shield defines an opening over the optical unit, where the area defined by the opening is equal to or less than an area defined by an aperture of the optical unit. Optionally, the EMI shield can include a transparent EMI attenuator (e.g., a conductive glass) covering the opening. The camera module can also include an adhesive (e.g., a dielectric adhesive, a conductive adhesive, etc.) between the circuit substrate and the first conductive portion and/or the second conductive portion of the EMI shield.

In a particular embodiment, the camera module includes a flexible circuit electrically coupled to the circuit substrate and the EMI shield includes a third conductive portion covering at least a portion of the flexible circuit. The third conductive portion can be an extension of the first conductive portion and/or the second conductive portion. The third conductive portion can also cover a connector electrically coupled to the flexible circuit. In a more particular embodiment, the flexible circuit substrate are positioned in a passageway defined by the first and second conductive portions of the EMI shield, and the third conductive portion shields the passageway.

The first conductive portion of the EMI shield and the second conductive portion of the EMI shield are discrete, complementary structures in some embodiments. In one such embodiment, the first conductive portion of the EMI shield covers the optical unit, at least a portion of the top surface of the circuit substrate, and at least a portion of a sidewall between the top and bottom surfaces of the circuit substrate, and the second conductive portion of the EMI shield covers at least the bottom surface of the circuit substrate. Optionally, the second conductive portion of the EMI shield can also cover a portion of the sidewall of the circuit substrate. Accordingly, a footprint of the EMI shield is greater than a footprint of the circuit substrate, and the second conductive portion of the EMI shield can be in contact with the first conductive portion around at least a portion of a perimeter of the first conductive portion. In other embodiments, the first conductive portion and the second conductive portion of the EMI shield are formed from a single sheet of conductive material.

Thus, in summary, the EMI shield provides a means for shielding the image sensor, the optical unit, and the circuit substrate, including its top surface, bottom surface, and sidewall, of a camera module from electromagnetic radiation at the camera module level.

The present invention is also directed to an EMI shield for a camera module. An EMI shield according to the present invention includes a first conductive structure and a second conductive structure. The first conductive structure includes an optical unit receiving portion and a circuit substrate mounting portion surrounding the optical unit receiving portion, and the second conductive structure is configured to abut the first conductive structure around at least a portion of a perimeter of the circuit substrate mounting portion. The optical unit receiving portion also defines a light-admitting aperture at an end opposite the circuit substrate mounting portion, and is configured to receive an optical unit of a camera module therein. Additionally, the circuit substrate mounting portion is configured to be coupled to a first surface (e.g., the top surface) of a circuit substrate of the camera module when the optical unit, which is mounted to the first surface of the circuit substrate, is positioned in the optical unit receiving portion. The second conductive structure is further configured to cover a second surface (e.g., the bottom surface) of the circuit substrate opposite the first surface when the second conductive structure is positioned to abut the first conductive structure.

In a particular embodiment, at least one of the first conductive structure and the second conductive structure defines an extension configured to further shield a flexible circuit substrate of the camera module. In a more particular embodiment, when the first conductive structure and the second conductive structure are in abutment, they define a passageway configured to pass the flexible circuit therethrough, and the passageway is also shielded by the extension. In another particular embodiment, the EMI shield can include a conductive EMI attenuator (e.g., a conductive glass or plastic cover, etc.) covering the light admitting aperture of the first conductive structure.

A method for manufacturing a camera module is also disclosed and includes the steps of providing a first conductive portion of an EMI shield, providing a second conductive portion of an EMI shield, and providing a camera module subassembly including a circuit substrate, an image sensor mounted on the circuit substrate, and an optical unit. The method also includes a step of mounting the first conductive portion of an EMI shield to the camera module subassembly such that the first conductive portion covers the optical unit and a first (top) surface of the circuit substrate of the camera module subassembly. Such method also includes a step of mounting the second conductive portion of the EMI shield to the camera module subassembly such that the second conductive portion is coupled to the first conductive portion and such that the second conductive portion covers a second (bottom) surface of the circuit substrate, which is opposite the first surface of the circuit substrate. Where the circuit substrate includes a flexible circuit substrate, the step of mounting the first conductive portion of the EMI shield further includes mounting a third conductive portion of the EMI shield, which can extend from the first conductive portion and/or second conductive portion, over the flexible circuit substrate. Another particular method includes the steps of providing an EMI attenuator and covering an opening through the first conductive portion (to be disposed over the optical unit) with the transparent EMI attenuator.

In yet another particular method the step of providing the camera module subassembly includes the steps of providing the circuit substrate, providing the image sensor, mounting the image sensor on the substrate, and mounting the optical unit to a top surface of the circuit substrate such that the optical unit can focus an image on the array of photosensing pixels of the image sensor. In such a particular method, the first conductive portion of the EMI shield covers the top surface of the circuit substrate and the second conductive portion covers a bottom surface of the circuit substrate.

Another method for manufacturing a camera module according to the invention includes the steps of providing a camera module subassembly, providing a flexible sheet of conductive material, and wrapping the camera module subassembly in the flexible sheet, where the camera module subassembly includes a circuit substrate, an image sensor mounted on the circuit substrate, and an optical unit. According to this method, the step of wrapping also includes covering an optical unit and a first surface of the circuit substrate having the optical unit mounted thereon with the flexible sheet, and further covering an entire second surface of the circuit substrate, which is opposite to the first surface, with the flexible sheet.

BRIEF DESCRIPTION OF THE DRAWINGS

The present invention is described with reference to the following drawings, wherein like reference numbers denote substantially similar elements:

FIG. 5A is a bottom view of a first conductive structure of the EMI shield of FIG. 2;

FIG. 5B is a top view of a second conductive structure of the EMI shield of FIG. 2;

DETAILED DESCRIPTION

The present invention overcomes the problems associated with the prior art by providing an EMI shield at the camera module level that improves EMI shielding and EM compatibility, especially for frequencies in the megahertz and gigahertz bands, by shielding the substantially the whole camera module. In the following description, numerous specific details are set forth (e.g., particular designs of EMI shield structures, adhesive patterning, etc.) in order to provide a thorough understanding of the invention. Those skilled in the art will recognize, however, that the invention may be practiced apart from these specific details. In other instances, details of well-known camera module design and fabrication practices (e.g., particular circuitry designs, techniques for bonding camera module componentry together, etc.) and components have been omitted, so as not to unnecessarily obscure the present invention.

Figure 1A:
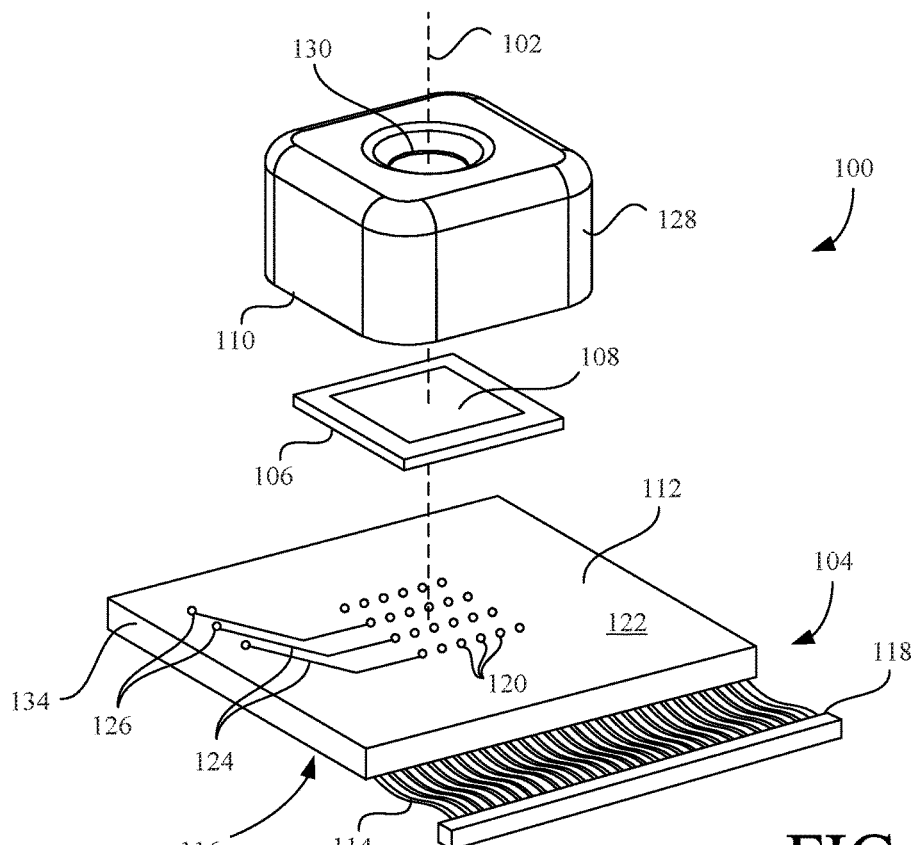
FIG. 1A is an exploded perspective view of an exemplary camera module subassembly.

FIG. 1A is a perspective view of an exemplary camera module subassembly 100 exploded along its optical axis 102. Camera module subassembly 100 includes a printed circuit board (PCB) 104, an image sensor 106 including an array of photosensitive pixels 108, and an optical unit 110. PCB 104 is a "rigid-flex" PCB because it includes a rigid substrate 112 and a flexible circuit substrate (a ribbon) 114. Flexible circuit substrate 114 is electrically coupled to a bottom surface 116 of rigid substrate 112 at a first end and includes a connector 118 at a second end. Connector 118 is configured to electrically connect camera module subassembly 100 with a camera hosting device (e.g., an automobile, a manufacturing machine, a medical device, a cell phone, etc.).

Image sensor 106 captures images using pixel array 108 and communicates those images to the camera hosting device via flexible circuit substrate 114 and connector 118. Image sensor 106 is electrically coupled to rigid substrate 112 via a plurality of conductive bond pads 120 formed on a top surface 122 of rigid substrate 112. Additionally, rigid substrate 112 can include a plurality of conductive traces 124 formed on or near its top surface 122 and/or a plurality of vias 126 formed through rigid substrate 112. Traces 124 and vias 126 electrically couple image sensor 106 and the circuitry formed on the top and bottom surfaces 122 and 116, respectively, as necessary so that image sensor 106 can carry out its image capture functions and communicate with the camera hosting device via connector 118. PCB layout and design is well-known to those skilled in the art and, therefore, will not be discussed herein in significant detail. Accordingly, the circuitry and bond-pad layout of PCB 104 is shown only representationally.

Optical unit 110 includes a housing 128 defining an aperture 130. Optical unit 110 includes one or more optical elements to focus an image on the pixel array 108 of image sensor 106. Image sensor 106 can then capture the focused image and provide it to the camera hosting device via PCB 104 and connector 118.

Figure 1B:
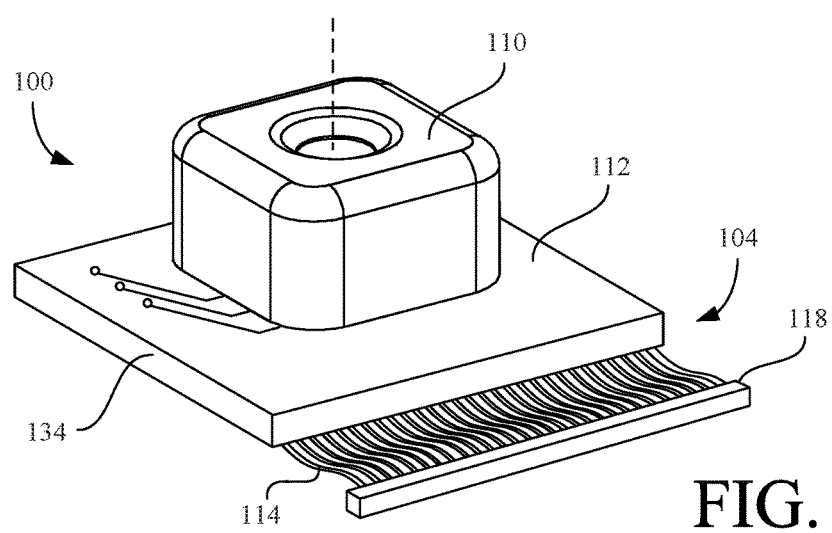
FIG. 1B is a perspective view of the camera module subassembly of FIG. 1A in an assembled state.

FIG. 1B is a perspective view showing camera module subassembly 100 in an assembled state. Again, those skilled in the art will recognize that the particular design of camera module subassembly 100 and its components (e.g., PCB 104, optical unit 110, etc.) will depend greatly on the application.

Figure 2:
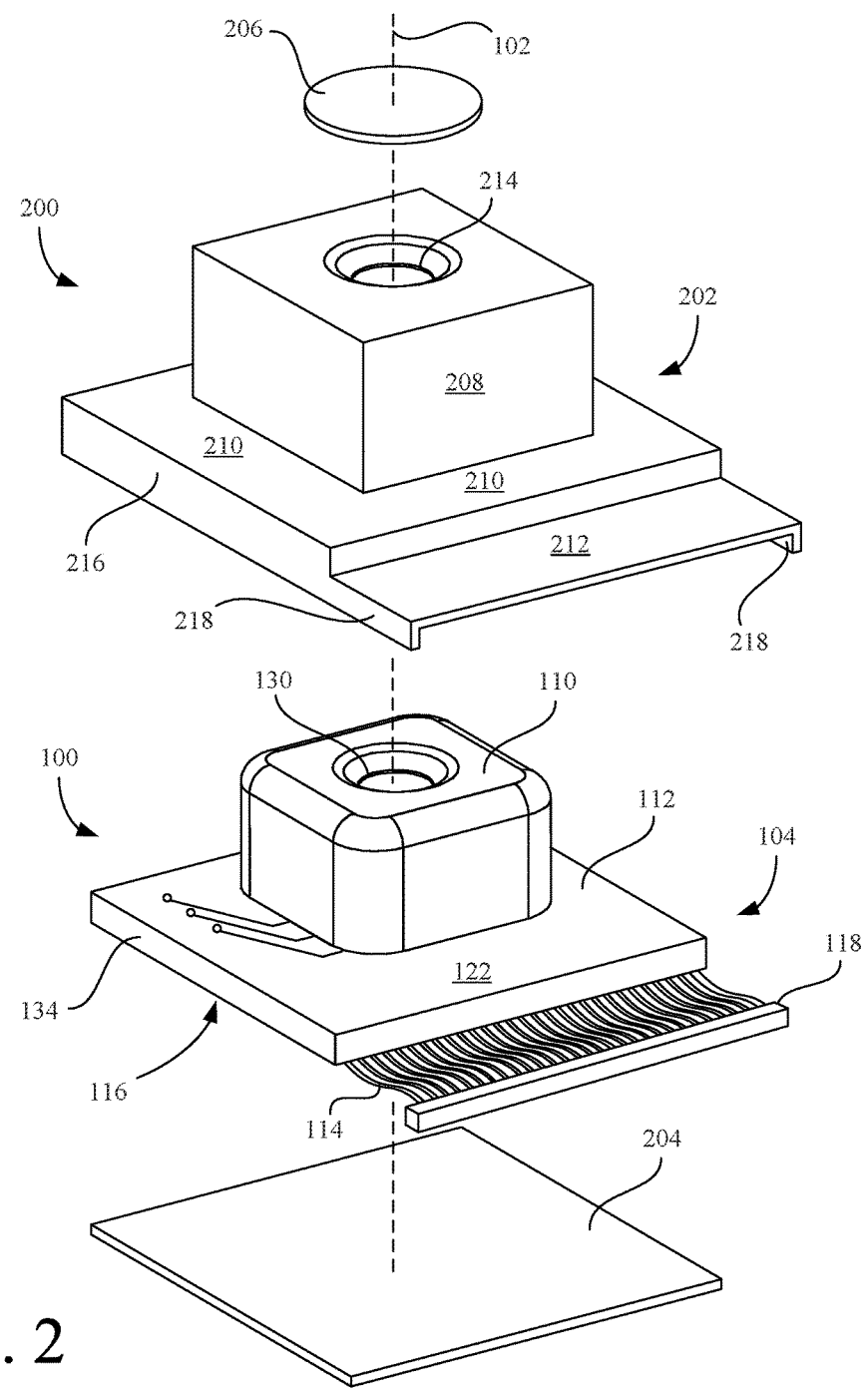
FIG. 2 is an exploded perspective view of a camera module including the camera module subassembly of FIGS. 1A-1B and an EMI shield according to one embodiment of the present invention.

FIG. 2 is an exploded perspective view illustrating an EMI shield 200 according to the present invention being installed on camera module subassembly 100. In this embodiment, EMI shield 200 includes a first conductive structure 202, a second conductive structure 204, and a cover 206.

First conductive structure 202 includes an optical unit receiving portion 208, a PCB receiving portion 210, and an extension 212 extending from the PCB receiving portion 210. First conductive structure 202 also defines an aperture 214 in the optical unit receiving portion 208. In a particular embodiment, the aperture 214 has a diameter equal to or less than the diameter of aperture 130 of optical unit 110.

First conductive structure 202 is configured to receive and house camera module subassembly 100 therein. For example, optical unit receiving portion 208 is sized to receive optical unit 110 therein such that aperture 130 of optical unit 110 is positioned under aperture 214. Additionally, PCB receiving portion 210 is sized to receive and seat the rigid substrate 112 of PCB 104 therein, such that the top surface 122 of rigid substrate 112 can be mounted to the underside of PCB receiving portion 210. PCB receiving portion 210 further includes an apron 216 that is configured to surround a sidewall 134 of rigid substrate 112, when camera module subassembly 100 is installed. Furthermore, extension 212 is located and sized to accommodate flexible circuit substrate 114 and connector 118 of camera module subassembly 100 thereunder.

Second conductive structure 204 is complementary to first conductive structure 202. In particular, second conductive structure 204 is a conductive plate or sheet that is sized to abut at least some of the lower perimeter of an apron 216. Second conductive structure 204 is also sized to cover the entire bottom surface 116 of rigid substrate 112. Additionally, when first and second conductive structures 202 and 204 are in abutment, they define a passageway (FIG. 4) therebetween. This passageway enables the flexible circuit substrate 214 to be positioned under extension 212 and permits the flexible substrate 114 to flex (e.g., up and down) without binding, for example, for connection to the camera hosting device.

Cover 206 is an optional component that can be installed on first conductive structure 202 over the light-admitting aperture 214. Cover 206 is sized to fully cover aperture 214, is optically transparent, and functions to attenuate electromagnetic radiation in general and microwave radiation in particular. In a particular embodiment, cover 206 is made from a glass or plastic substrate that is coated with a conductive material, such as indium tin oxide (ITO). However, other transparent, conductive materials can be used to make cover 206.

Figure 3:
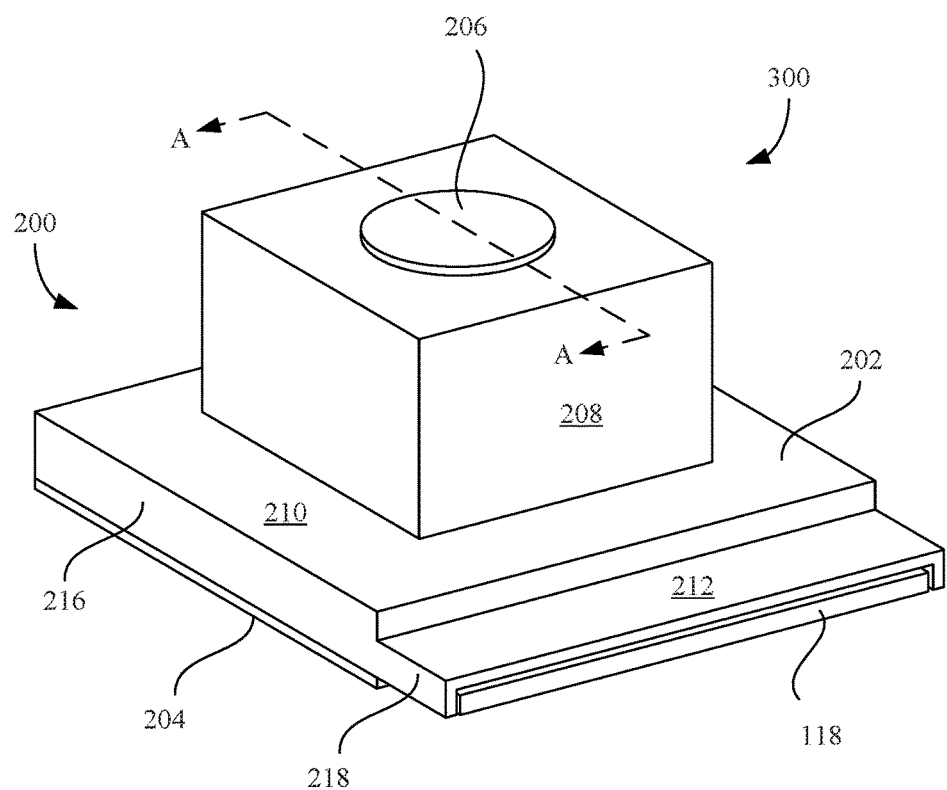
FIG. 3 is a perspective view showing the camera module of FIG. 2 in an assembled state.

FIG. 3 is a perspective view showing a camera module 300 according to the invention in an assembled state. Camera module 300 includes the EMI shield 200 installed over the exemplary camera module subassembly 100. As shown, a perimeter region (FIG. 5B) of the second conductive structure 204 abuts the underside of apron 216 of the first conductive structure and, together, first and second conductive structures 202 and 206 enclose camera module subassembly 100 in a protective EMI shield 200. Additionally, cover 206 has been affixed to the first conductive structure 202 to add EMI protection over the aperture 214. Furthermore, the flexible circuit substrate 114 of PCB 104 and connector 118 are positioned under and shielded by extension 212. Notably, extension 212 also includes an apron 218 that shields the sides of flexible circuit substrate 114 and connector 118. Advantageously, substantially all of camera module 300 is protected by EMI shielding.

Figure 4:
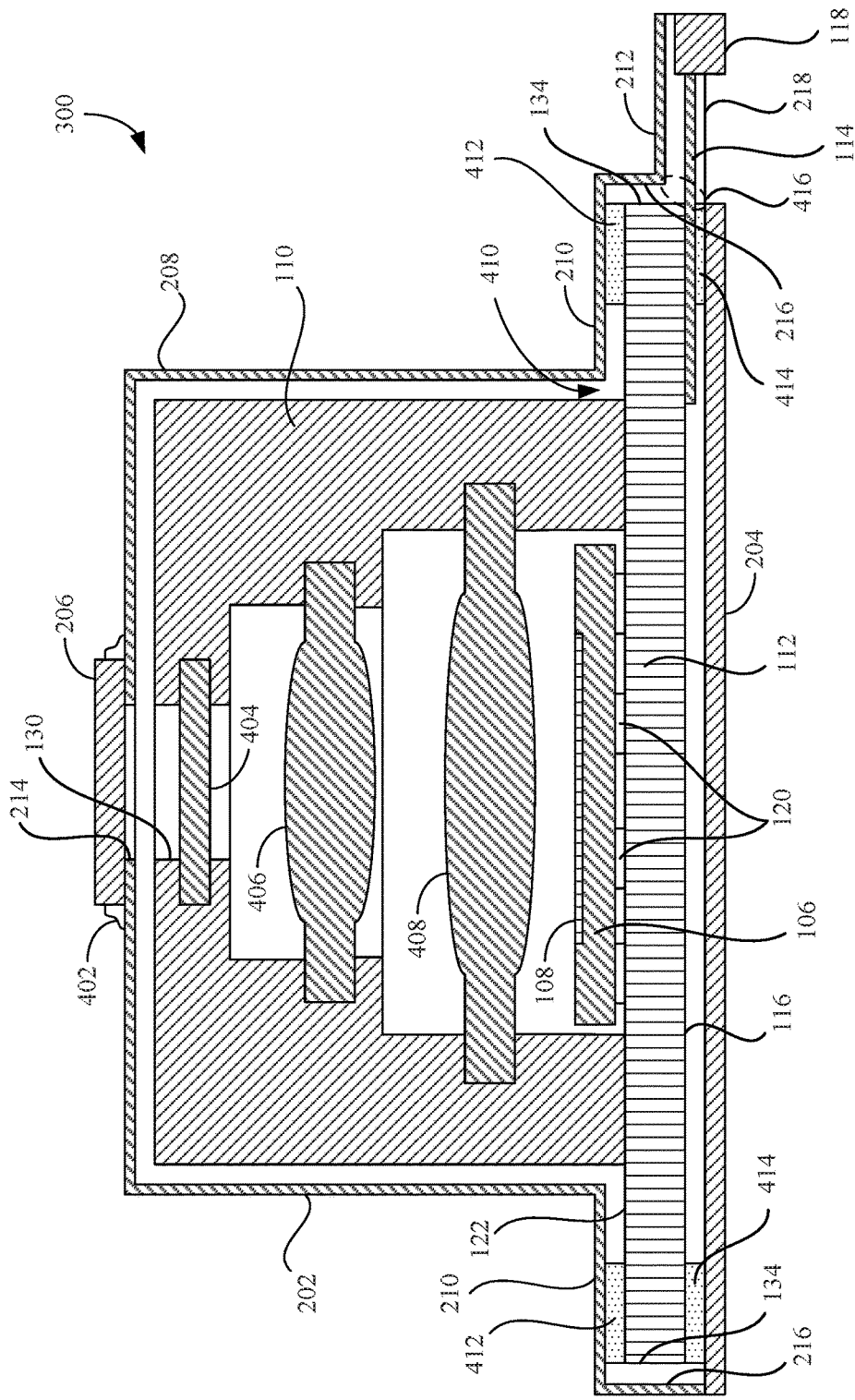
FIG. 4 is a cross-sectional view of the camera module of FIG. 3.

FIG. 4 is a cross-sectional view of camera module 300 taken along section line A-A of FIG. 3. FIG. 4 shows several features of camera module 300 in greater detail. For example, FIG. 4 shows that the aperture 214 in the first conductive structure 202 of EMI shield 200 has the same diameter as aperture 130 of optical unit 110. Because the aperture 214 is small, aperture 214 produces less of an antenna affect than the prior art. Additionally, any such affect is attenuated and minimized by cover 206, which is affixed to structure 202 using an adhesive 402.

FIG. 4 also shows that optical unit 110 includes a first optical element 404, a second optical element 406, and a third optical element 408. In this embodiment, the first optical element 404 is a protective cover or a filter, and the elements 406 and 408 are lenses. Optical elements 404, 406, and 408 are configured and arranged to provide a focused image on pixel array 108. Optical unit 110 can be affixed to the top surface 122 of substrate 112 using, for example, an adhesive (not shown). Indeed, the particular configurations of optical unit 110 and the lenses therein are not particularly germane to the present invention. Therefore, these features are represented in character only.

The first conductive structure 202 also defines a receiving aperture 410 opposite the aperture 214. Receiving aperture 410 is generally defined by the junction between optical unit receiving portion 208 and PCB receiving portion 210 of first conductive structure 202. As shown, the receiving aperture 410 is large enough to receive the optical unit 110 therethrough. Additionally, the internal volume defined by optical unit receiving portion 208 is large enough to house optical unit 110, and optical unit receiving portion 208 can be shaped to help guide the aperture 130 into position relative to aperture 214. The PCB receiving portion 210 is generally shaped complementary to the top surface 122 of rigid substrate 212 outside optical unit 110, so that the top surface 122 of rigid substrate can be affixed to PCB receiving portion 210 using an adhesive 412 (e.g., a dielectric adhesive, a conductive adhesive, etc.). FIG. 4 also illustrates how the apron 216 of the first conductive structure extends downward from the PCB receiving portion 210 and covers the sidewall 134 of rigid substrate 112.

FIG. 4 also shows how the second conductive structure 204 of EMI shield 200 covers the full bottom surface 116 of rigid substrate 112. In particular, second conductive structure 204 is complementary to first conductive structure such that it abuts the bottom surface of apron 216 around three sides of first conductive structure 204. Additionally, the structure 204 is affixed to the bottom surface 116 of rigid substrate 112 using an adhesive 414 (e.g., a dielectric adhesive, a conductive adhesive, etc.). Because flexible circuit substrate 114 is coupled to bottom surface 116 of rigid substrate 112, adhesive 414 can also be placed between second conductive structure 204 and flexible circuit substrate 114 as shown.

Moreover, when the first and second conductive structures 202 and 204 are coupled together as shown, they define a passageway 416 therebetween, which both accommodates flexible circuit substrate 114 and positions flexible circuit substrate 114 and connector 118 under extension 212. The passageway 416 allows flexible circuit substrate 114 to flex (e.g., up and down as shown) so that connector 118 can be engaged with a complementary connector (not shown) of a host device, for example, by movement in the vertical direction. Even though passageway 416 exists, EMI shield 200 still effectively shields the full camera module 300 because extension 212 overlies the top and sides of passageway 416, flexible circuit substrate 114, and connector 118.

EMI shield 200 can be manufactured in a variety of ways. For example, first conductive structure 202 and second conductive structure 204 can be stamped from a sheet of conductive material (e.g., a sheet of copper, aluminum, etc.). Optionally, structures 202 and 204 can be stamped from the same sheet of metal and remain connected, so they can be installed in a clam-shell fashion over camera module subassembly 100. As another option, structures 202 and 204 can be formed (e.g., by molding, etc.) and then plated or coated in a conductive material. As still another option, structure 202 and 204 can be formed from a conductive thermoplastic or resin.

Furthermore, it should be noted that structures 202 and 204 can be modified in a variety of ways. For example, camera module subassembly 100 might include additional components, such as an outer housing, an actuator, etc., and the size and shape of structure 202 can be adjusted accordingly. As yet another example, the size and shape of PCB receiving portion 210 can be altered depending on the size and shape of PCB 104 and/or for other factors, such as to accommodate passive components mounted on PCB 104. As still another example, second conductive structure 204 could be modified to include an extension under at least a portion of flexible circuit substrate 114 and complementary to extension 212. As yet another example, structure 204 could also be modified to include one or more stand-offs to help support the bottom rigid substrate 112.

It should be further noted that structures 202 and/or 204 can be fabricated to include mounting structures (e.g., tabs for adhesive, wings for engaging fasteners, etc.) that facilitate mounting camera module 300 to a camera module hosting device. Such structures, or other metal grounding structures, can also be provided to facilitate grounding of EMI shield 200 and/or camera module subassembly 100 to the camera hosting device. For example, metal grounding can be provided to electrically connect one or more ground terminals (e.g., one of traces 124, one or vias 126, etc.) of the rigid substrate 112 of PCB 104 to the first and/or second conductive structures 202 and/or 204. In such a case, a conductive adhesive 412 and/or 414 can be used to complete the electrical connection(s) between the ground terminal(s) of the rigid substrate 112 and the EMI shield 200. Such metal grounding can also serve as a mechanical support to hold the EMI shield 200.

The EMI shield 200 provides important advantages over the prior art. In particular, substantially all of the camera module subassembly 100 is shielded by EMI shield 200. EMI shield 200 is particularly effective, because it covers the full bottom surface 116 of the rigid substrate 112, as well as, covers the flexible circuit substrate 114 and connector 118 via extension 212. EMI shield 200 also does not include any large, uncovered apertures around its optical unit 110 that could otherwise function as antenna(s) for EM radiation in the vicinity of image sensor 106. Moreover, even if the optional cover 206 were removed, the EMI shielding of camera module 300 would be significantly better than the prior art, because the size of the aperture 214 in the first conductive structure 202 is small (e.g., the same size as the aperture 130 of optical unit 110 or less). For these reasons, the EMI shield 200 greatly reduces the electromagnetic interference incident upon image sensor 106. Conversely, EMI shield 200 also protects other components of the camera hosting device from EM emissions from image sensor 106. Accordingly, EMI shield 200 increases the electromagnetic compatibility (EMC) of camera module 300 with other electronic componentry in the same camera hosting device.

FIG. 5A is a bottom view of first conductive structure 202 of EMI shield 200 looking into aperture 410, which is defined by the interface of PCB receiving portion 210 and optical unit receiving portion 208. As shown in FIG. 5A, strips of adhesive 412 are applied around aperture 410, which are used to affix the top surface 122 of rigid substrate 112 to the PCB receiving portion 210. FIG. 5A also shows a bottom surface 502 of the aprons 216 and 218 of first conductive structure 202.

FIG. 5B is a top view of second conductive structure 204. Structure 204 includes a plurality of strips of adhesive 414 applied thereto, which are used to bond the top surface of conductive structure 204 to the bottom surface 116 of rigid substrate 112. FIG. 5B also includes a dashed line 502, which indicates the contact area on structure 204 that abuts the bottom surface 502 of apron 216 when structure 204 is installed. As mentioned previously, in this embodiment, structure 204 is large enough to shield the entire bottom surface 116 of rigid substrate 112. Additionally, structure 204 covers aperture 410 and the bottom surface 502 of apron 216, which prevents these structures from acting as antennas in the vicinity of image sensor 106.

In some embodiments, the strips of adhesive 412 and 414 are formed from dielectric adhesive, which serves to electrically isolate rigid substrate 112 from EMI shield 200. However, in other embodiments, a conductive adhesive 412 and 414 can be used, for example, to connect one or more ground terminals of PCB 104 (e.g., some of traces 124 and/or vias 126 on rigid substrate 112) to EMI shield 200. In still other embodiments, some of the strips of adhesive 412 and 414 can be formed from conductive adhesive and others can be formed from dielectric adhesive, for example, depending on the locations of PCB ground terminals.

Figure 6:
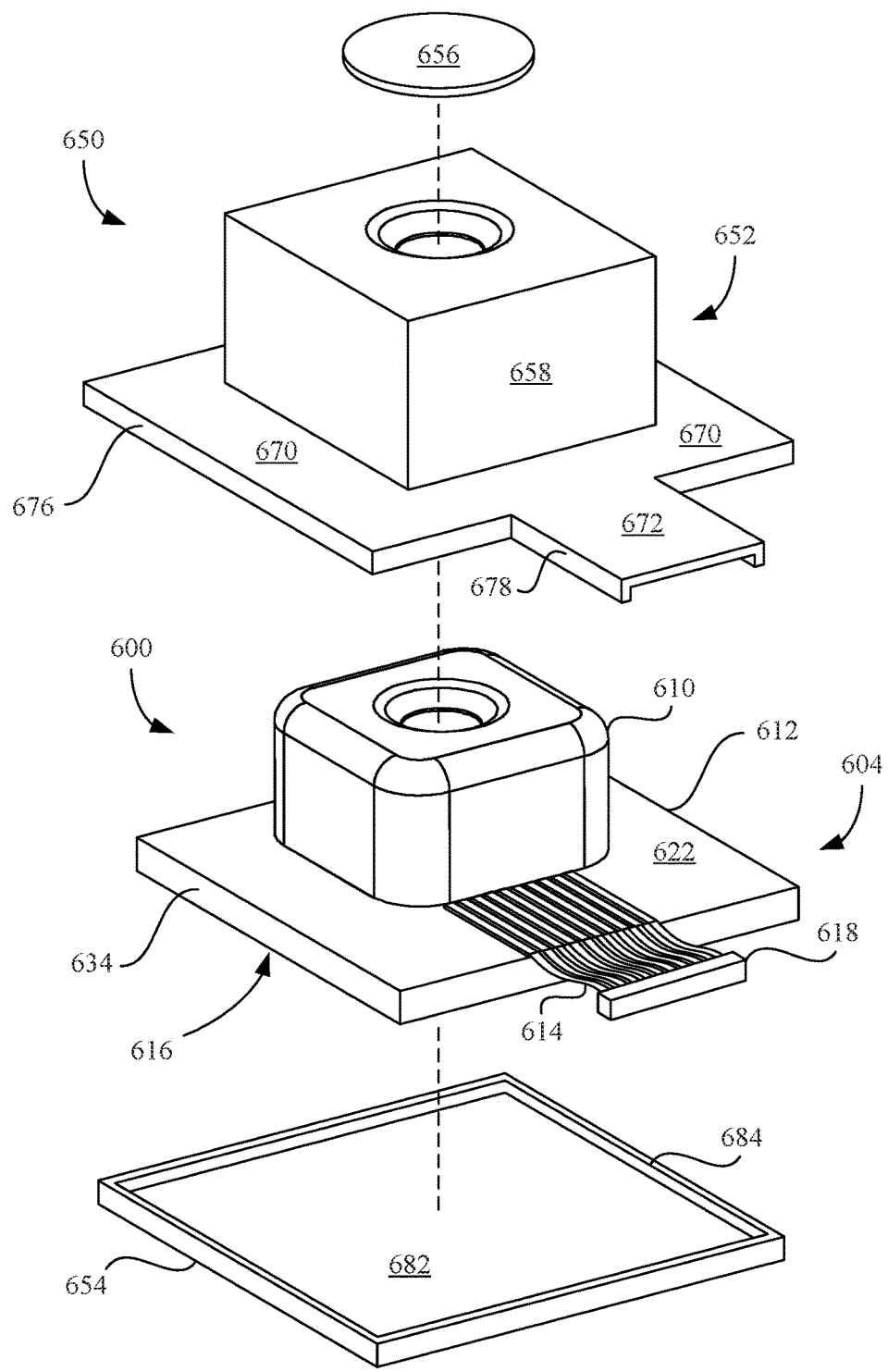
FIG. 6 is an exploded perspective view of a camera module including a camera module subassembly and an EMI shield according to an alternative embodiment of the invention.

FIG. 6 is an exploded perspective view illustrating an alternative EMI shield 650 being installed on an alternative camera module subassembly 600 according to the present invention. Camera module subassembly 600 is similar to camera module subassembly 100, because it includes an optical unit 610 surrounding an image sensor 606. However, subassembly 600 includes an alternative rigid-flex PCB 604, which comprises a flexible circuit substrate 614 electrically coupled to (or near) a top surface 622 of a rigid substrate 612. Additionally, in this alternative embodiment, flexible circuit substrate 614 is narrower than flexible circuit substrate 114 and, therefore, a narrower connector 618 coupled to its distal end. As explained above, rigid substrate 612 will include circuitry that electrically couples image sensor 106 and flexible circuit substrate 614.

Alternative EMI shield 650 includes a first conductive structure 652, a second conductive structure 654, and a cover 656. First conductive structure 652 is substantially similar to first conductive structure 202, except that it includes a narrower extension 672 (as compared to extension 212 of shield 200) and has a PCB receiving portion 670 with an alternative geometry (as compared to portion 210) in view of the narrower extension 672. First conductive structure 652 also includes shorter aprons 676 and 678 (as compared to aprons 216 and 218), and apron 676 also wraps around the fourth side of PCB receiving portion 670 to connect with the apron 678 of extension 672. The optical unit receiving portion 658 is substantially similar to the optical unit receiving portion 208 of shield 200.

Second conductive structure 654 includes a base 682 surrounded by a sidewall 684. The heights of sidewall 684 and of apron 676 are selected so that they enclose a sidewall 634 of the rigid substrate 612 when the structures 652 and 654 are installed over camera module subassembly.

Figure 7:
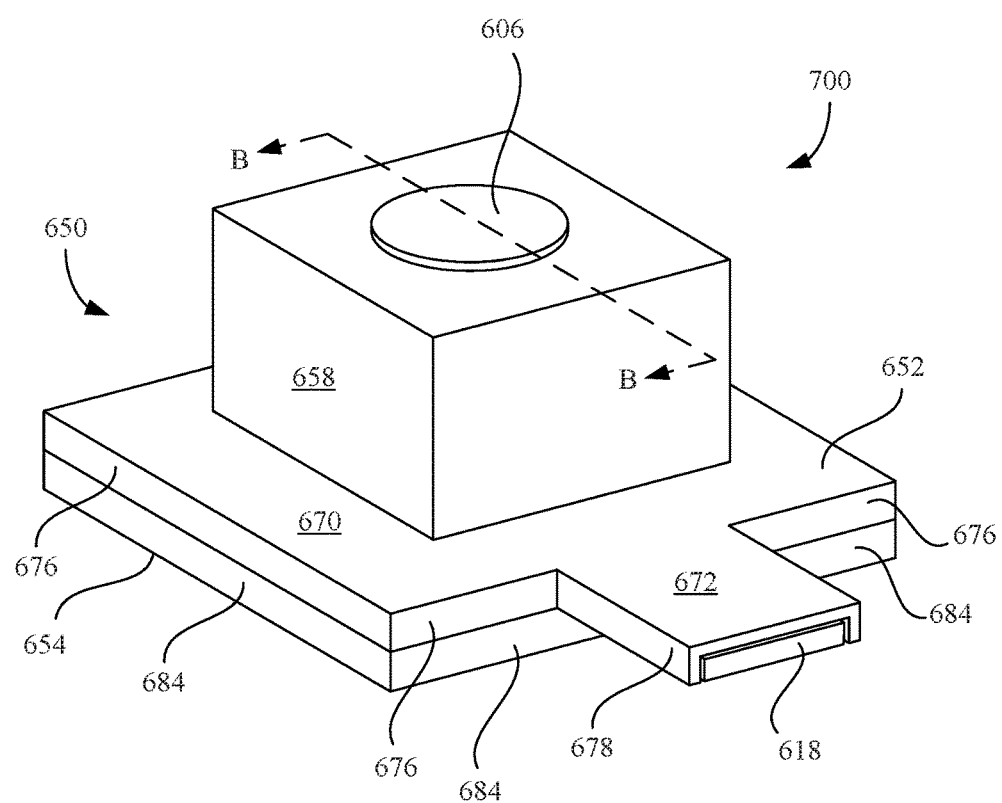
FIG. 7 is a perspective view showing the camera module of FIG. 6 in an assembled state.

FIG. 7 is a perspective view showing a camera module 700 according to the invention in an assembled state. FIG. 7 is a perspective view showing alternative EMI shield 650 installed over camera module subassembly 600. As shown, the sidewall 684 of the second conductive structure 654 surrounds the apron 676 of the first conductive structure 652 and, together, first and second conductive structures 252 and 254 enclose camera module subassembly 600 in an EMI shield 650. Additionally, a smaller extension 672 is needed to cover flexible circuit substrate 614 and connector 618, apron 676 and sidewall 684 join to cover portions of the fourth side of sidewall 634 of rigid substrate 612 adjacent to and below extension 672. As in FIG. 3, the extension 672 is sized so that the connector 618 is positioned near the distal end of extension 672 for easy access and attachment to the camera hosting device.

Figure 8:
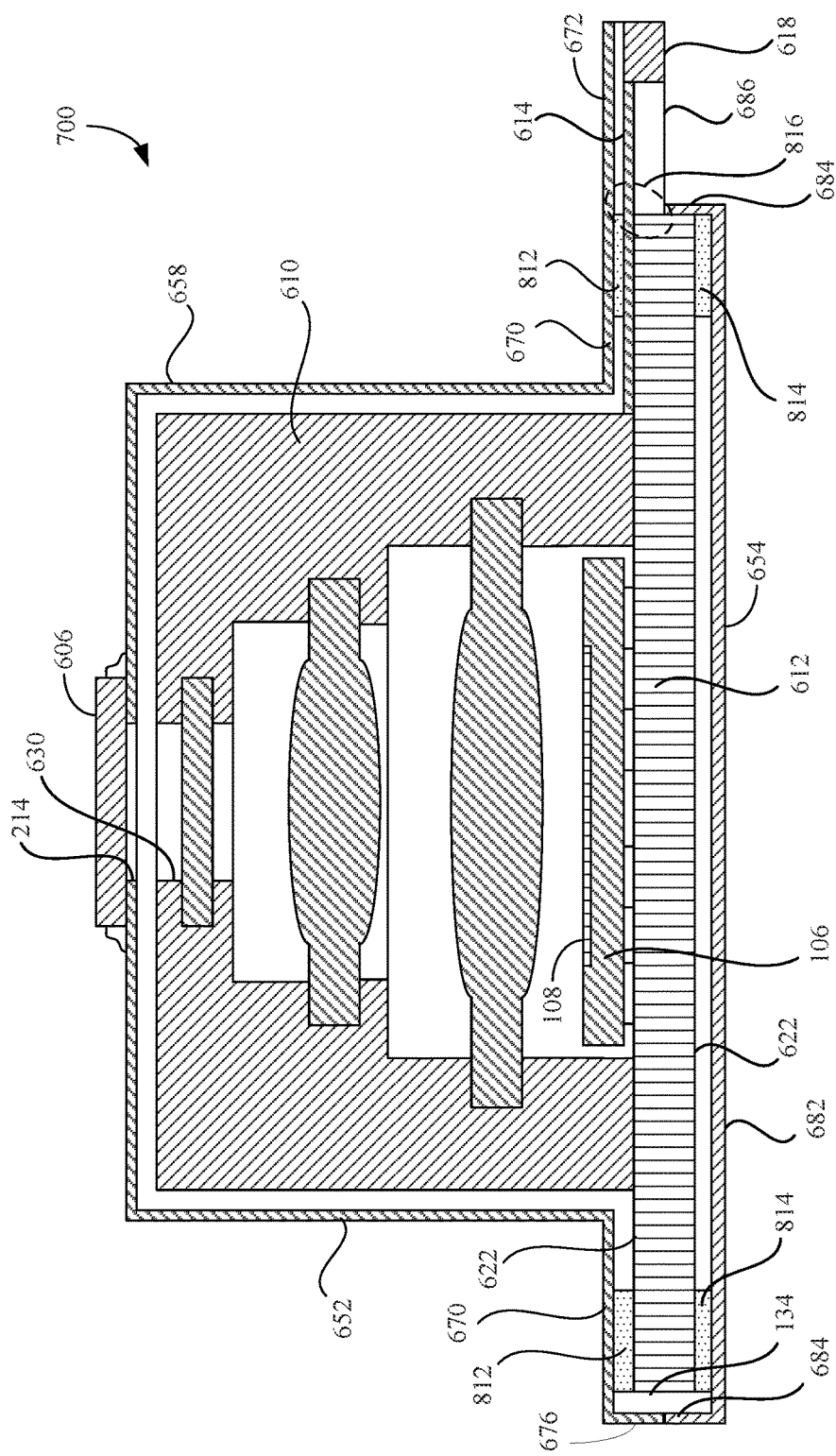
FIG. 8 is a cross-sectional view of the camera module of FIG. 7.

FIG. 8 is a cross-sectional view of camera module 700 taken along section line B-B of FIG. 3. As shown in FIG. 8, apron 676 of first conductive structure 652 and sidewall 684 of second conductive structure 654 abut each other approximately at the midpoint of sidewall 634 of rigid substrate 612. Adhesive is again used to affix EMI shield 650 in position on substrate 612. In particular, the PCB receiving portion 670 of first conductive structure 652 is affixed to the top surface 622 of rigid substrate 612 using a plurality of adhesive bonds 812, some of which can extend over a portion of flexible circuit substrate 614. Additionally, the top surface of base 682 of second conductive structure 654 is affixed to bottom surface 616 rigid substrate 612 using adhesive bonds 814.

FIG. 8 also shows that, when coupled together, the first and second conductive structures 652 and 654 define a passageway 816 therebetween, which accommodates flexible circuit substrate 614 therethrough and helps positions substrate 614 and connector 618 under extension 672 and between portions of apron 686. The passageway 816 also allows flexible circuit substrate 614 to flex (e.g., up and down as shown) so that connector 618 can be plugged into a complementary connector of a camera hosting device.

As with the prior embodiment, the alternative EMI shield 650 provides an advantage over the prior art because it shields substantially all of camera module subassembly 600. Additionally, even though passageway 816 is present, passageway 814, flexible circuit substrate 614, and connector 618 are still shielded by the top and apron 686 of extension 672. Furthermore, EMI shield 650 can be modified as indicated. For example, second conductive structure 654 might be modified to include its own extension protruding from sidewall 684 under extension 672. As another example, the optical unit receiving portion 658 of structure 652 could be modified in view of other elements (e.g., outer housings, actuators, etc.) of camera module subassembly 600. Accordingly, the disclosure provided herein should not be construed as limiting.

Figure 9:
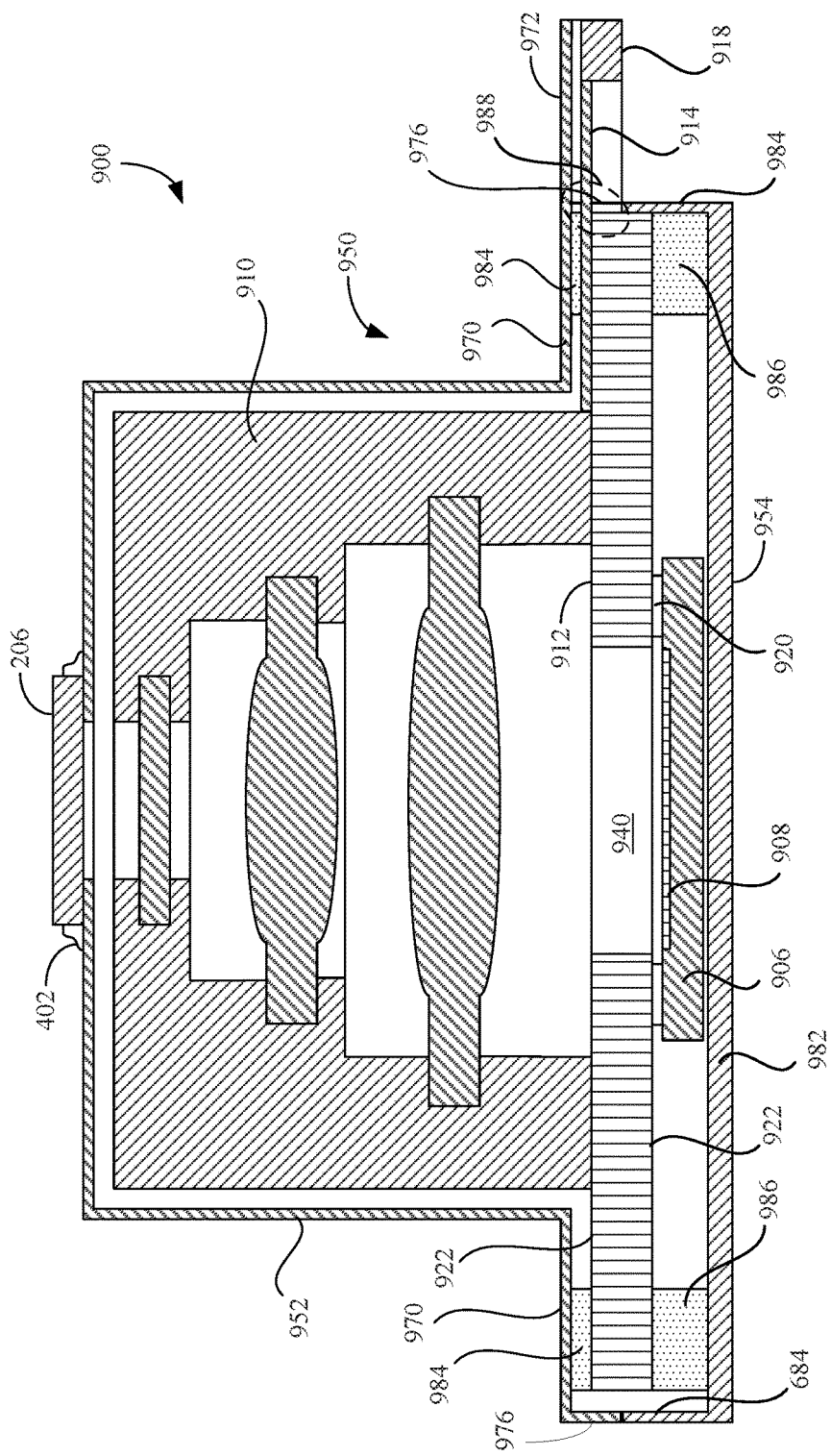
FIG. 9 is a cross-sectional view of a camera module including a camera module subassembly and an EMI shield according to still another embodiment of the invention.

FIG. 9 is a cross-sectional view of a camera module 900, including an EMI shield 950 according to yet another embodiment of the present invention. In this embodiment, camera module 900 includes a rigid-flex PCB 904, an image sensor 906 including a sensor array 908, and an optical unit 910. Rigid-flex PCB 904 includes a rigid substrate 912 and a flexible circuit substrate 914 mounted to rigid substrate 912 similar to prior embodiments. However, in this embodiment, image sensor 906 is flip-chip mounted to a bottom surface 916 of rigid substrate 912 under an aperture 940 via a plurality of conductive bond pads 920, and optical unit 910 focuses an image on sensor array 908 through aperture 940. Flip-chip mounting is well-known in the art and will not be discussed in detail herein.

EMI shield 950 includes a first conductive structure 952 and a second conductive structure 954. First conductive structure 952 is similar to first conductive structure 652 (FIG. 6). Second conductive structure 954 includes a base 980 and a sidewall 982, also similar to the embodiment shown in FIG. 6. However, in the embodiment in FIG. 9, the height of sidewall 982 is extended to provide the additional depth needed to accommodate the flip-chip-mounted image sensor 906. First conductive structure 952 and second conductive structure 954 are affixed to rigid substrate 912 using adhesive bonds 984 and 986 and provide a passageway 988 for flexible circuit substrate 914 therebetween, similar to prior embodiments.

Figure 10A:
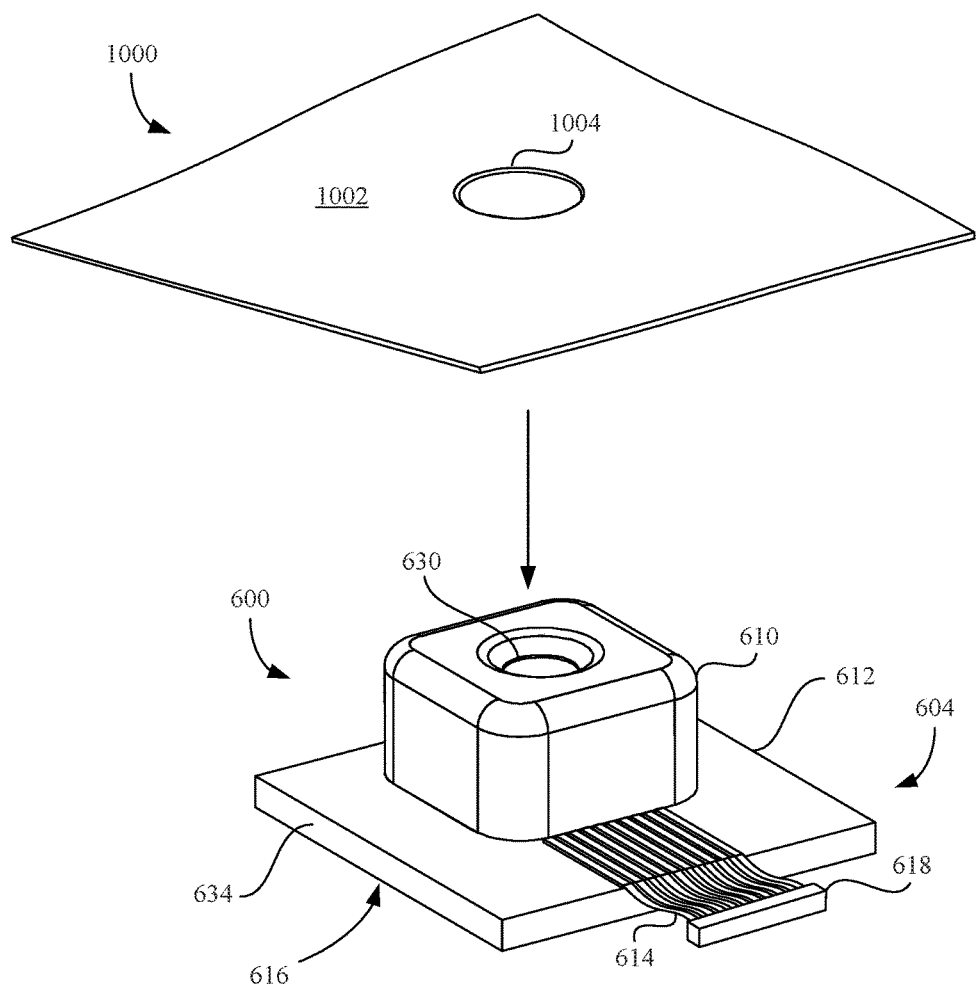
FIGS. 10A-10C illustrate an EMI shield installed on a camera module subassembly according to still another embodiment of the invention.
Figure 10B:
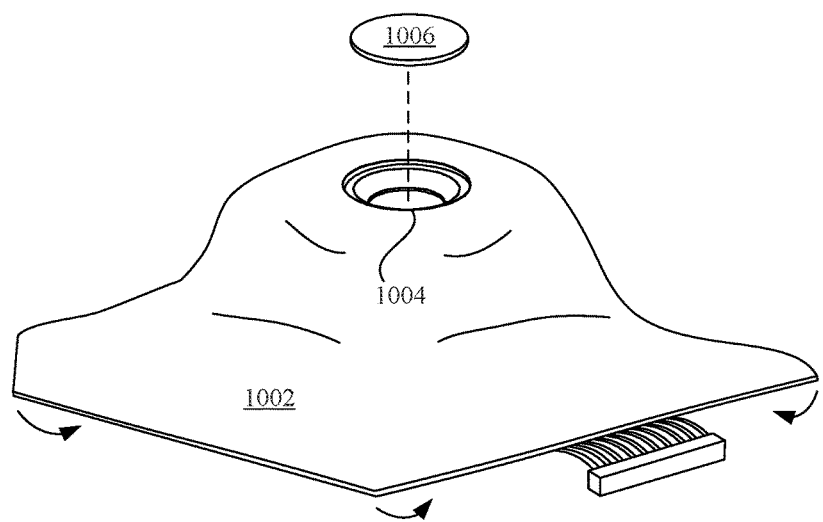
Figure 10C:
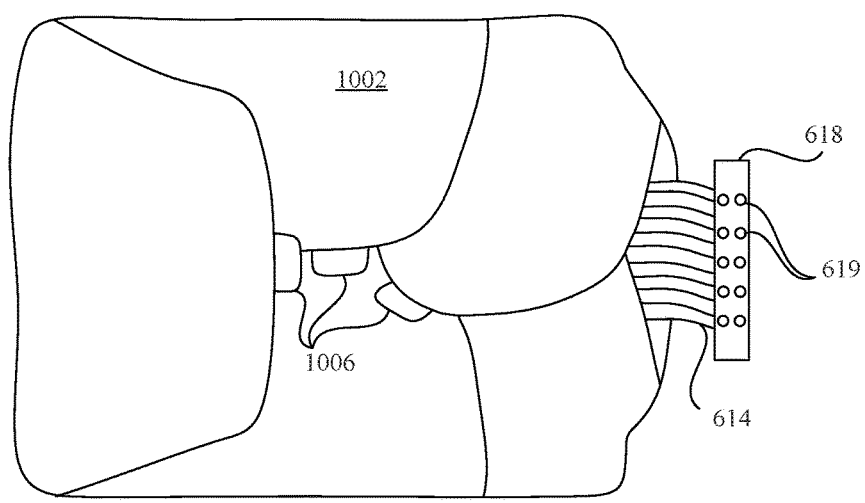

FIGS. 10A-10C illustrate another alternative EMI shield 1000 according to the present invention being installed on camera module subassembly 600. In this embodiment, EMI shield 1000 is a sheet of conductive foil 1002 (e.g., a copper foil, etc.) having an aperture 1004 formed therein. The aperture 1004 is placed over the aperture 630 of the lens unit 610 of camera module subassembly 600, and then foil 1002 is wrapped around camera module subassembly 600, including at least some of flexible circuit substrate 614, and under rigid substrate 612 as shown in FIG. 10B. FIG. 10C shows that foil 1002 is secured around rigid substrate 612 using a plurality of adhesive bonds 1006, as needed, to retain the loose ends of foil 1002 in position. A cover 1006 (e.g., formed from glass or plastic), which is substantially similar to cover 206, can optionally be installed (e.g., with an adhesive) over the aperture subassembly 1004.

Advantageously, foil 1002 covers the entire bottom surface 616 of rigid substrate 612 and includes an aperture 1004 that is sized approximately equal to, or less than, the size of aperture 630 of optical unit 610. FIGS. 10B-10C also show that foil 1002 is wrapped around camera module subassembly 600 to allow a portion of flexible circuit substrate 614 and connector 618 to protrude therefrom. This allows connector 618 to be readily connected to a complementary connector of a camera hosting device, for example, by engaging the pin holes 619 on the bottom of connector 618 with pins of the complementary connector. FIGS. 10A-10C illustrate a convenient way to implement an EMI shield according to the invention, where the foil 1002 can be readily sized to surround different camera modules.

Figure 11A:
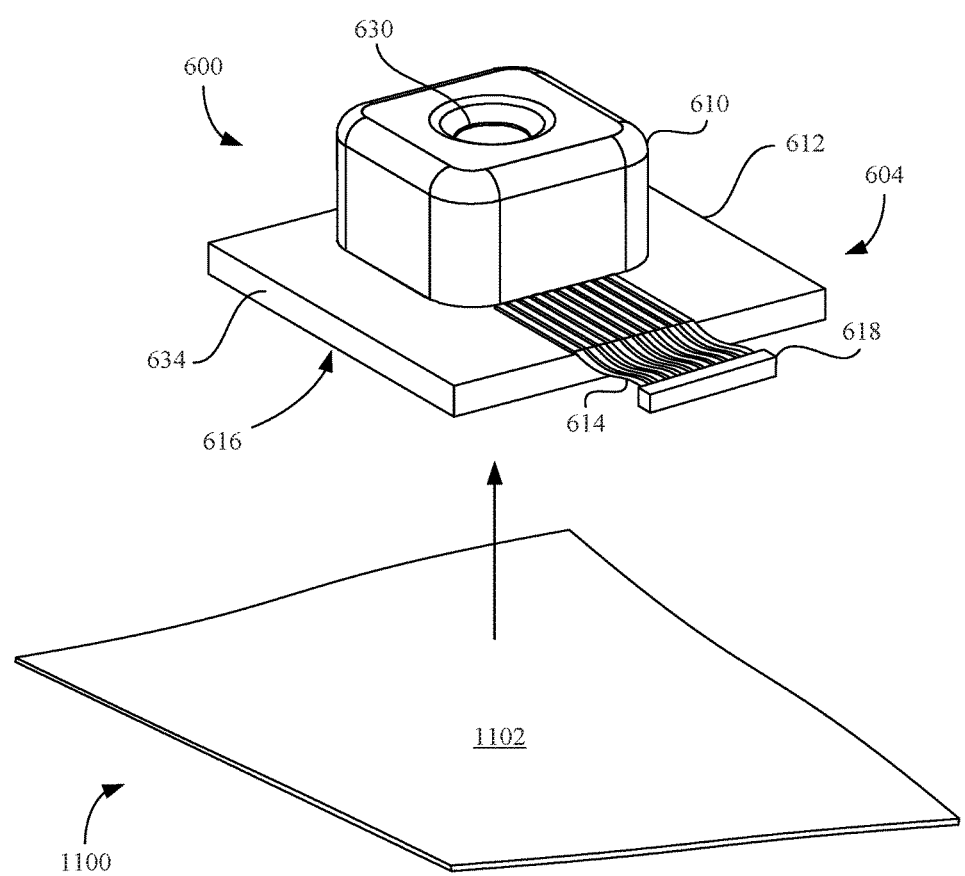
FIGS. 11A-11B illustrate an EMI shield installed on a camera module subassembly according to yet another embodiment of the invention.
Figure 11B:
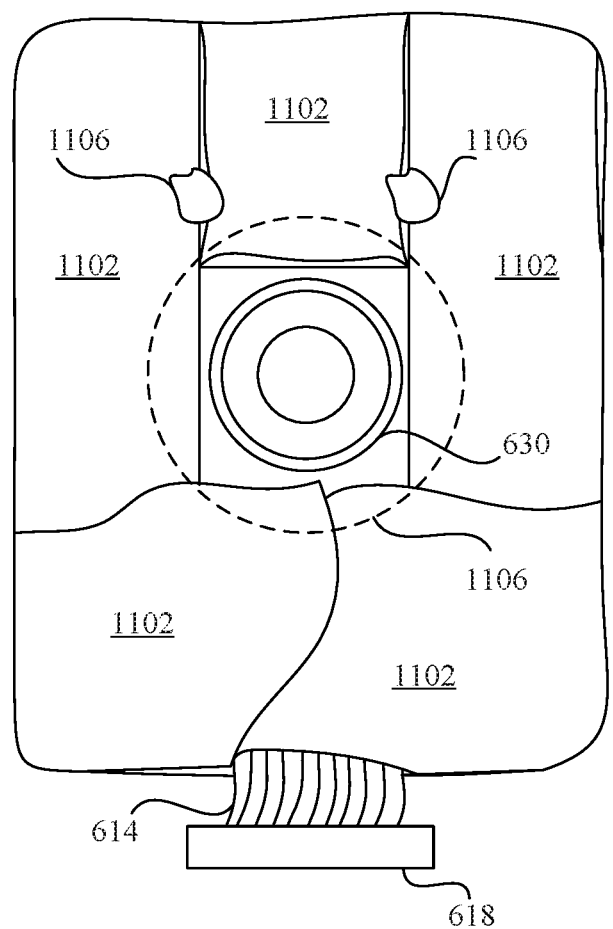

FIGS. 11A-11B illustrate still another alternative EMI shield 1100 according to the present invention being installed on camera module subassembly 600. Here, the EMI shield comprises a continuous sheet of conductive foil 1102, which is free of any apertures therethrough. Foil 1102 is positioned under the bottom surface 616 of rigid substrate 612 and then wrapped up and around optical unit 610 and the top surface 622 of rigid substrate 612. The foil 1102 is wrapped and positioned around camera module subassembly 600, including at least some of flexible circuit substrate 614, so that it defines an aperture (an uncovered area) over aperture 630 of optical unit 610. Optionally, an adhesive 1106 and/or a cover 1106 (similar to cover 206) could then be installed over the aperture 630 and foil 1102 to help retain the folds and ends of the foil in position and/or to cover aperture 630. These and other embodiments are possible in view of the disclosure made herein.

As mentioned above, the EMI shields of the present invention provide important advantages over the prior art, because they shield substantially all of the camera module subassembly. The EMI shields of the invention are particularly effective because they shield the entire bottom surface of the rigid portion of the PCB substrate and, in many embodiments, also shield the flexible circuit substrate of the PCB and a connector with a shield extension. Additionally, the opening in the EMI shield is sized as small as possible, for example, approximately equal to the size of the aperture in the optical unit of the camera module subassembly. Additionally, the invention provides an optional EMI-attenuating cover, which can be installed over the light-admitting opening in the EMI shield.

The EMI shields of the invention, therefore, do not include any large, open apertures near the image sensor that could otherwise act as an antenna and interfere with the functionality of the image sensor. Thus, the electromagnetic interference incident upon image sensor 106 is greatly reduced. Additionally, the EMI shields of the present invention also protect other components of the camera hosting device from EM emissions from the image sensor and, therefore, improve the electromagnetic compatibility (EMC) of the camera module.

The inventors verified the improvements provided by an EMI shield of the present invention by conducting comparison tests on a camera module without an EMI shield according to the present invention (the "reference camera module") and on the same reference camera module including an EMI shield according to the present invention ("the inventive camera module"). The inventors used a transverse electromagnetic (TEM) cell and a spectrum analyzer to measure the radiated emissions from the reference and inventive camera modules in both horizontal and vertical positions.

The experimental results indicated that the inventive camera module had significantly lower radiated emissions across most frequencies in the high MHz to low GHz range in both the horizontal and vertical positions than the reference camera module. For example, in horizontal position testing, the reference camera module had radiated emissions of approximately 22.0 decibels per microvolt (dBµV), 23.3 dBµV, and 27.3 dBµV at frequencies of 900 MHz, 1800 MHz (1.8 GHz), and 2700 MHz (2.7 GHz), respectively. The inventive camera module had radiated emissions of approximately 11.3 dBµV, 21.3 dBµV, and 9.0 dBµV at the same frequencies, respectively. This translates into reductions of radiated emissions of approximately 48.6%, 8.6%, and 67.0%, respectively, in the inventive camera module. Similarly, in vertical position testing, the reference camera module had radiated emissions of approximately 32.3 dBµV and 28.7 dBµV at frequencies of 1800 MHz (1.8 GHz) and 2700 MHz (2.7 GHz), respectively, whereas the inventive camera module had radiated emissions of approximately 20.9 dBµV and 15.3 dBµV at the same frequencies, respectively. This translates into reductions of radiated emissions of approximately 35.3% and 46.7%, respectively, in the inventive camera module. For the vertical position testing, the reference and inventive camera modules had approximately the same performance at 900 MHz.

The above testing, therefore, indicates that the inventive camera module significantly reduces radiated emissions over the reference camera module and, therefore, will also have better electromagnetic compatibility (EMC) as compared to the reference camera module. For these same reasons, the inventive camera module will be less susceptible to external electromagnetic interference than the reference camera module, will help the camera modules and camera hosting devices pass EMC tests, help camera hosting device designers solve EMI issues.

Methods of the present invention will now be described with reference to FIGS. 12-13. For the sake of clear explanation, these methods might be described with reference to particular elements of the previously-described embodiments. However, it should be noted that other elements, whether explicitly described herein or created in view of the present disclosure, could be substituted for those cited without departing from the scope of the present invention. Therefore, it should be understood that the methods of the present invention are not limited to any particular elements that perform any particular functions. Furthermore, some steps of the methods presented herein need not necessarily occur in the order shown. For example, in some cases two or more method steps may occur simultaneously. These and other variations of the methods disclosed herein will be readily apparent, especially in view of the description of the present invention provided previously herein, and are considered to be within the full scope of the invention.

Figure 12:
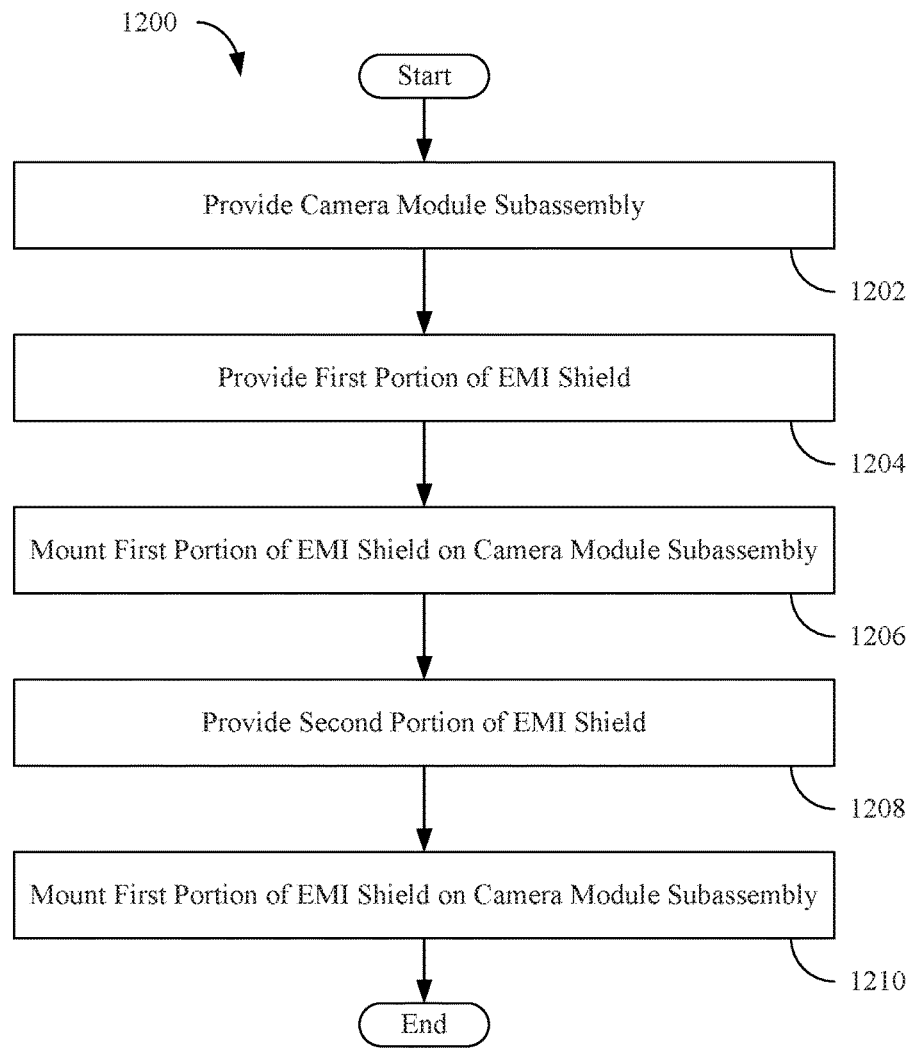
FIG. 12 is a flowchart summarizing a method of manufacturing a camera module according to the present invention.

FIG. 12 is a flowchart summarizing a method 1200 for manufacturing a camera module according to the present invention. In a first step 1202, a camera module subassembly is provided, which includes, for example, a circuit substrate, an image sensor mounted on the circuit substrate, and an optical unit. In a second step 1204, a first conductive portion of an EMI shield is provided, and in a third step 1206, the first conductive portion of the EMI shield is mounted on the camera module subassembly such that the first conductive portion covers the optical unit and a first (e.g., top) surface of the circuit substrate of the camera module subassembly. In a fourth step 1208, a second conductive portion of the EMI shield, which is complementary to the first conductive portion of the EMI shield, is provided. Then, in a fifth step 1210, the second conductive portion of the EMI shield is mounted on the camera module subassembly such that the second conductive portion is coupled to the first conductive portion and covers a second (bottom) surface of said circuit substrate opposite to said first surface.

Figure 13:
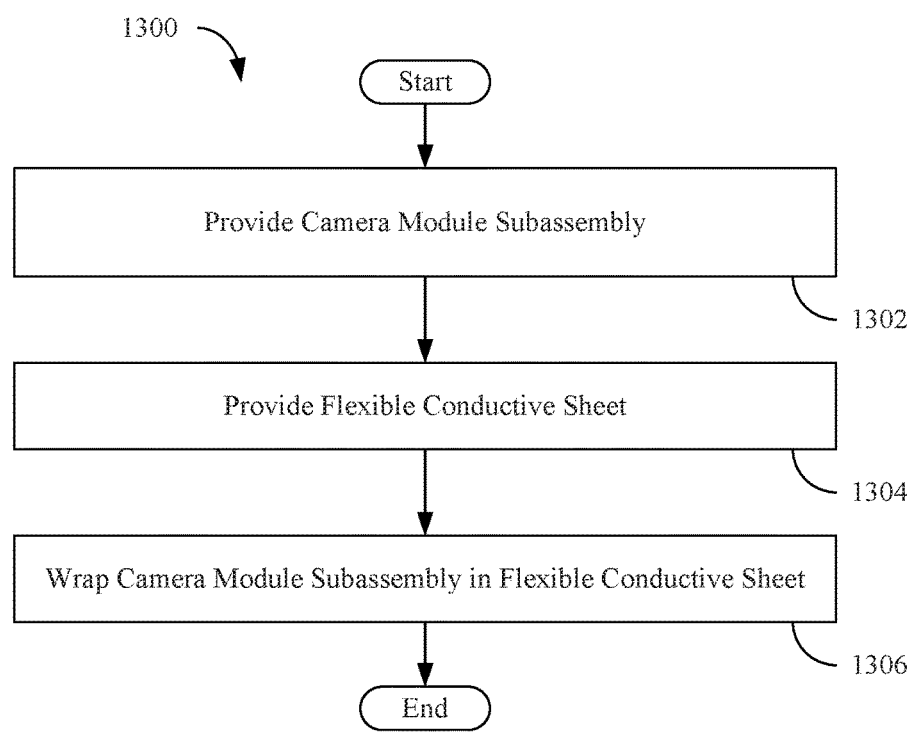
FIG. 13 is a flowchart summarizing another method of manufacturing a camera module according to the present invention.

FIG. 13 is a flowchart summarizing another method 1300 for manufacturing a camera module according to the present invention. In a first step 1302, a camera module subassembly is provided, which includes a circuit substrate, an image sensor mounted on the circuit substrate, and an optical unit. In a second step 1304, a flexible sheet of conductive material is provided. In a third step 1306, the camera module subassembly is wrapped in the flexible sheet of conductive material. More particularly, the step of wrapping 1306 includes covering the optical unit and a first (top) surface of the circuit substrate having the optical unit mounted thereon with the flexible sheet and also covering an entire second (bottom) surface of the circuit substrate, which is located opposite the first surface, with the flexible sheet.

The description of particular embodiments of the present invention is now complete. Many of the described features may be substituted, altered or omitted without departing from the scope of the invention. For example, an extension for the flexible circuit substrate can be provided off of the second conductive portion of the EMI shield alternatively, or in addition to, the first conductive portion. As another example, the EMI shields of the present invention can be manufactured with structures for grounding the EMI shield, for example, to the camera hosting device. These and other deviations from the particular embodiments shown will be apparent to those skilled in the art, particularly in view of the foregoing disclosure.

We claim:

1. A camera module comprising:
   a circuit substrate having a top surface and a bottom surface opposite said top surface;
   an image sensor mounted on said circuit substrate, said image sensor including a pixel array of photosensing pixels formed therein;
   an optical unit coupled to said top surface of said circuit substrate over said pixel array, said optical unit including at least one optical element, said optical unit being configured to focus an image on said pixel array; and
   an EMI shield including a first conductive portion covering said optical unit and a second conductive portion covering said bottom surface of said circuit substrate, said second conductive portion being in contact with said first conductive portion; and
   a flexible circuit electrically coupled to said circuit substrate; and wherein
   said EMI shield includes a third conductive portion covering at least a portion of said flexible circuit; and
   said third conductive portion is an extension of at least one of said first conductive portion and second conductive portion.

2. The camera module of claim 1, further comprising:
   a connector electrically coupled to said flexible circuit; and wherein
   said third conductive portion covers at least a portion of said connector.

3. The camera module of claim 1, wherein:
   said first conductive portion and second conductive portion of said EMI shield define a passageway having said flexible circuit positioned therethrough; and
   said passageway is shielded by said third conductive portion.

4. The camera module of claim 1, wherein said circuit substrate and said flexible circuit comprise a rigid-flex printed circuit board.

5. The camera module of claim 1, wherein:
   said first conductive portion of said EMI shield comprises an opening positioned over an aperture of said optical unit; and
   an area defined by said opening of said first conductive portion is equal to or less than an area defined by said aperture of said optical unit.

6. The camera module of claim 5, wherein said EMI shield further includes an EMI attenuator covering said opening.

7. The camera module of claim 1, wherein said first conductive portion of said EMI shield and said second conductive portion of said EMI shield are discrete, complementary structures.

8. The camera module of claim 7, wherein:
   said first conductive portion of said EMI shield covers said optical unit, at least a portion of said top surface of said circuit substrate, and at least a portion of a sidewall of said circuit substrate between said top surface and said bottom surface; and
   said second conductive portion of said EMI shield covers at least said bottom surface of said circuit substrate.

9. The camera module of claim 8, wherein said second conductive portion of said EMI shield further covers at least a portion of said sidewall of said circuit substrate.

10. The camera module of claim 8, wherein a footprint of said EMI shield is greater than a footprint of said circuit substrate.

11. The camera module of claim 8, wherein said second conductive portion of said EMI shield is in contact with said first conductive portion of said EMI shield around at least a portion of a perimeter of said first conductive portion.

12. The camera module of claim 1, further comprising an adhesive between said circuit substrate and at least one of said first conductive portion and said second conductive portion of said EMI shield.

13. The camera module of claim 12, wherein said adhesive is a conductive adhesive.

14. The camera module of claim 1, wherein said first conductive portion and said second conductive portion of said EMI shield are formed from a single sheet of conductive material.

15. The camera module of claim 1, wherein said extension is integrally-formed with said at least one of said first conductive portion and said second conductive portion.

16. The camera module of claim 1, wherein said extension is a physical extension of said first conductive portion such that said first conductive portion and said third conductive portion are a single continuous structure.

17. The camera module of claim 16, further comprising:
   a host device connector disposed at a distal end of said flexible circuit, said host device connector configured to electrically couple said circuit substrate and a camera module hosting device; and wherein said extension covers at least a portion of said host device connector.

18. An EMI shield for a camera module, said EMI shield comprising:
a first conductive structure including an optical unit receiving portion and a circuit substrate mounting portion surrounding said optical unit receiving portion, said optical unit receiving portion defining a light-admitting aperture at an end opposite said circuit substrate mounting portion;
a second conductive structure configured to abut said first conductive structure around at least a portion of a perimeter of said circuit substrate mounting portion; and wherein
said optical unit receiving portion is configured to receive an optical unit of said camera module therein;
said circuit substrate mounting portion is configured to be coupled to a first surface of a circuit substrate of said camera module when said optical unit is positioned in said optical unit receiving portion, said optical unit being coupled to said first surface of said circuit substrate;
said second conductive structure is configured to cover a second surface of said circuit substrate when said second conductive structure is positioned to abut said first conductive structure, said second surface of said circuit substrate being opposite to said first surface; and
at least one of said first conductive structure and said second conductive structure defines an extension formed continuously therewith, said extension being configured to shield a flexible circuit substrate of said camera module.

19. The EMI shield of claim 18, wherein:
when said first conductive structure and said second conductive structure are in abutment, said first conductive structure and said second conductive structure define a passageway configured to pass said flexible circuit substrate therethrough; and
said passageway is shielded by said extension.

20. The EMI shield of claim 18, further comprising an EMI attenuator covering said light-admitting aperture of said first conductive structure.

21. The EMI shield of claim 18, wherein said extension is a physical extension extending from said circuit substrate mounting portion of said first conductive structure.

22. The EMI shield of claim 21, wherein:
said extension is configured to cover a host device connector disposed at a distal end of said flexible circuit substrate of said camera module; and
said host device connector is configured to electrically couple said circuit substrate of said camera module and a camera module hosting device.

23. A method for manufacturing a camera module, said method comprising:
providing a camera module subassembly including a circuit substrate, an image sensor mounted on said circuit substrate, and an optical unit;
providing a first conductive portion of an EMI shield;
mounting said first conductive portion of an EMI shield on said camera module subassembly, said first conductive portion covering said optical unit and a first surface of said circuit substrate of said camera module subassembly;
providing a second conductive portion of an EMI shield; and mounting said second conductive portion of said EMI shield on said camera module subassembly such that said second conductive portion is coupled to said first conductive portion, said second conductive portion covering a second surface of said circuit substrate opposite to said first surface; and wherein
said circuit substrate comprises a flexible circuit substrate electrically coupled to a rigid circuit substrate;
said first conductive portion of said EMI shield includes a third conductive portion extending therefrom; and
said step of mounting said first conductive portion of said EMI shield further comprises mounting said third conductive portion over said flexible circuit substrate.

24. The method of claim 23, further comprising:
providing a transparent EMI attenuator; and
covering an opening through said first conductive portion of said EMI shield with said transparent EMI attenuator; and wherein
said opening through said first conductive portion of said EMI shield is disposed above an aperture of said optical unit.

25. The method of claim 23, wherein said step of providing said camera module subassembly comprises:
providing said circuit substrate, said circuit substrate having a top surface and a bottom surface opposite said top surface,
providing said image sensor, said image sensor having an array of photosensing pixels formed therein,
mounting said image sensor on said circuit substrate,
providing said optical unit, said optical unit including at least one optical element, and
mounting said optical unit to said top surface of said circuit substrate such that said optical unit can focus an image on said array of photosensing pixels; and
said first and said second surfaces of said circuit substrate comprise said top surface and said bottom surface of said circuit substrate, respectively.

26. A method for manufacturing a camera module, said method comprising:
providing a camera module subassembly including a circuit substrate, an image sensor mounted on said circuit substrate, and an optical unit;
providing a flexible sheet of conductive material;
wrapping said camera module subassembly in said flexible sheet; and wherein
said step of wrapping includes covering said optical unit and a first surface of said circuit substrate having said optical unit mounted thereon with said flexible sheet; and
said step of wrapping further includes covering an entire second surface of said circuit substrate with said flexible sheet, said second surface being opposite to said first surface.

27. A camera module comprising:
a circuit substrate having a top surface, a bottom surface opposite said top surface, and a sidewall between said top surface and said bottom surface;
an image sensor mounted on said circuit substrate, said image sensor including a pixel array of photosensing pixels formed therein;
a flexible circuit electrically coupled to said circuit substrate;
an optical unit coupled to said top surface of said circuit substrate over said pixel array, said optical unit including at least one optical element, said optical unit being configured to focus an image on said pixel array; and means for shielding said image sensor, said optical unit, said top surface, said bottom surface, and said sidewall of said circuit substrate from electromagnetic radiation; and wherein said means for shielding includes a first conductive portion, a second conductive portion, and an extension formed continuously with one of said first and said second conductive portions;

said first conductive portion covers said optical unit and said top surface of said circuit substrate;

said second conductive portion covers said bottom surface of said circuit substrate; and said extension covers said flexible circuit.

* * * * *